US006988626B2

(12) United States Patent
Varghese et al.

(10) Patent No.: US 6,988,626 B2
(45) Date of Patent: **\*Jan. 24, 2006**

(54) COMPUTER COMPONENT RACK MOUNTING ARRANGEMENT

(76) Inventors: Paily T. Varghese, 19410 Navarro Mills Dr., Tomball, TX (US) 77375; Robert J. Hastings, 26010 River Lawn, Kingwood, TX (US) 77339; Paul E. Westphall, 14507 Cypress Valley Dr., Cypress, TX (US) 77429

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/127,571

(22) Filed: Jul. 31, 1998

(65) Prior Publication Data

US 2001/0037985 A1 Nov. 8, 2001

(51) Int. Cl.
*A47F 7/00* (2006.01)
(52) U.S. Cl. .................... 211/26; 211/131.1; 312/334.4
(58) Field of Classification Search .................. 211/26, 211/151, 131.1; 312/334.4, 334.7, 334.8, 312/334.11, 334.17, 350
See application file for complete search history.

(56) References Cited

U.S. PATENT DOCUMENTS

| | | | | |
|---|---|---|---|---|
| 1,231,291 A | * | 6/1917 | Otte | 312/334.8 |
| 1,614,507 A | * | 1/1927 | Vogt | 312/408 |
| 1,736,108 A | * | 11/1929 | Bullen et al. | 312/286 |
| 1,938,908 A | * | 12/1933 | Hunter | 312/334.11 |
| 1,963,220 A | * | 6/1934 | Anderson | 312/334.8 X |
| 2,277,702 A | | 3/1942 | Kennedy | 45/77 |
| 2,312,326 A | * | 3/1943 | Earle | 62/288 |
| 2,346,167 A | * | 4/1944 | Jones et al. | 312/334.11 X |
| 2,679,447 A | * | 5/1954 | Bissman | 312/334.8 |
| 2,960,376 A | * | 11/1960 | Myers | 312/334.17 X |
| 3,059,978 A | * | 10/1962 | Fall | 308/3.6 |
| 3,092,429 A | | 6/1963 | Barnes | |
| 3,133,768 A | | 5/1964 | Klakovich | |
| 3,377,115 A | * | 4/1968 | Hansen et al. | 312/334.17 X |
| 3,488,097 A | * | 1/1970 | Fall | 312/334.11 X |
| 3,650,578 A | * | 3/1972 | Del Vecchio et al. | 308/3.8 |
| 3,679,274 A | | 7/1972 | Nance | |
| 3,687,505 A | * | 8/1972 | Fall et al. | 308/3.8 |
| 3,712,690 A | * | 1/1973 | Fall | 308/3.8 |
| 3,716,284 A | * | 2/1973 | Vogt | 312/350 X |

(Continued)

FOREIGN PATENT DOCUMENTS

DE 4223682 * 7/1992 ............... 211/26 X (Continued)

OTHER PUBLICATIONS

*COMPAQ Typhoon Mechanical Specification*, Version 0.01, Nov. 8, 1994 by Joseph Allen, Systems Division of Compaq Computer Corporation, 15 pages.

(Continued)

*Primary Examiner*—Bruce A. Lev

(57) ABSTRACT

A rail mounting arrangement for supporting a computer component, such as a server, in a rack includes a pair of support rails and slide rail assemblies supported by the support rail. The support rails are identical and include a pair of mounting regions on either side of a longitudinal axis. The slide rail assemblies have a lower profile than the support rails and may be mounted on either of the mounting regions. The slide rail assemblies are secured to the server and present a low profile, permitting greater access to internal components within the server housing for servicing. The support rails are recessed in the rack to reduce the space occupied by the rail system in the region of the rack in which the server is supported.

30 Claims, 6 Drawing Sheets

U.S. PATENT DOCUMENTS

| | | | |
|---|---|---|---|
| 3,738,716 A * | 6/1973 | Lambert | 308/3.8 |
| 3,778,120 A * | 12/1973 | Hagen et al. | 308/3.8 |
| 3,779,623 A | 12/1973 | Motohashi | 312/257 |
| 3,844,627 A | 10/1974 | Gutner | |
| 3,901,564 A * | 8/1975 | Armstrong | 308/3.8 |
| 3,912,341 A * | 10/1975 | Stein | 308/3.8 |
| 4,025,138 A * | 5/1977 | Kittle | 312/334 |
| 4,067,632 A * | 1/1978 | Sekerich | 312/341 R |
| 4,191,436 A * | 3/1980 | Cherry | 312/293 |
| 4,194,793 A * | 3/1980 | Offermans | 308/3.8 |
| 4,324,439 A * | 4/1982 | Hagen et al. | 308/3.8 |
| 4,331,369 A * | 5/1982 | Lazar et al. | 312/334 |
| 4,427,245 A * | 1/1984 | Litchfield et al. | 312/330 |
| 4,479,198 A | 10/1984 | Romano et al. | 361/683 X |
| 4,479,263 A | 10/1984 | Rowenfeldt et al. | 485/502 |
| 4,662,761 A * | 5/1987 | Hoffman | 384/18 |
| 4,772,079 A | 9/1988 | Douglas et al. | 312/257 R |
| 4,925,258 A * | 5/1990 | Ludwig et al. | 312/323 |
| 4,949,934 A | 8/1990 | Krenz et al. | 248/918 |
| 4,977,532 A | 12/1990 | Borkowicz et al. | 361/683 |
| 4,988,214 A * | 1/1991 | Clement | 384/18 |
| 5,090,787 A * | 2/1992 | Harley | 312/334.7 |
| 5,164,886 A | 11/1992 | Chang | 361/724 |
| 5,197,789 A | 3/1993 | Lin | 312/223.2 |
| 5,208,722 A | 5/1993 | Ryan et al. | 360/685 |
| 5,209,572 A * | 5/1993 | Jordan | 312/334.7 X |
| 5,262,923 A | 11/1993 | Batta et al. | 361/685 |
| 5,269,598 A | 12/1993 | Liu | 312/223.2 |
| 5,277,615 A | 1/1994 | Hastings et al. | 439/377 |
| 5,278,351 A | 1/1994 | Herrick | 361/683 |
| 5,340,340 A | 8/1994 | Hastings et al. | 312/223.1 |
| 5,388,032 A * | 2/1995 | Gill et al. | 700/17 |
| 5,397,176 A | 3/1995 | Allen et al. | 312/223.2 |
| 5,417,496 A * | 5/1995 | Hobbs | 384/18 |
| 5,438,476 A | 8/1995 | Steffes | 312/223.2 |
| 5,460,441 A | 10/1995 | Hastings et al. | 312/298 |
| 5,469,037 A | 11/1995 | McMurtrey, Sr. et al. | 312/223.2 |
| 5,472,272 A * | 12/1995 | Hoffman | 312/334.11 |
| 5,491,611 A | 2/1996 | Stewart et al. | 361/736 |
| 5,495,389 A | 2/1996 | Dewitt et al. | 361/683 |
| 5,551,775 A * | 9/1996 | Parvin | 312/334.11 |
| 5,571,256 A | 11/1996 | Good et al. | 211/26 |
| 5,572,402 A | 11/1996 | Jeong | 364/708.1 |
| 5,598,318 A | 1/1997 | Dewitt et al. | 361/683 |
| 5,632,542 A * | 5/1997 | Krivec | 312/334.7 |
| 5,681,102 A * | 10/1997 | Forsgren | 312/334.1 |
| 5,684,671 A | 11/1997 | Hobbs et al. | 361/683 |
| 5,717,575 A | 2/1998 | Copeland et al. | 361/725 |
| 5,726,866 A | 3/1998 | Allen | 361/816 |
| 5,734,557 A | 3/1998 | McAnally et al. | 361/727 |
| 5,737,184 A | 4/1998 | Lai | 361/638 |
| 5,768,097 A | 6/1998 | Jelinger | 361/683 |
| 5,772,294 A * | 6/1998 | Hendrich et al. | 312/334.8 X |
| 5,784,251 A | 7/1998 | Miller et al. | 361/683 |
| 5,784,252 A | 7/1998 | Villa et al. | 361/726 |
| 5,801,921 A * | 9/1998 | Miller | 361/686 |
| 5,823,647 A * | 10/1998 | Miyoshi | 312/333 |
| 5,833,337 A * | 11/1998 | Kofstad | 312/334.4 X |
| 6,142,590 A * | 11/2000 | Harwell | 312/223.1 |
| 6,181,549 B1 * | 1/2001 | Mills et al. | 361/683 |
| 6,296,338 B1 * | 10/2001 | Stijns | 312/333 |
| 2002/0104942 A1 | 8/2002 | Mimlitch, III et al. | |
| 2003/0052580 A1 | 3/2003 | Dobler et al. | |
| 2003/0193781 A1 | 10/2003 | Mori | |
| 2004/0080247 A1 | 4/2004 | Dobler et al. | |
| 2004/0120123 A1 | 6/2004 | Mayer | |
| 2004/0159618 A1 | 8/2004 | Nguyen et al. | |
| 2004/0217073 A1 | 11/2004 | Dobler et al. | |

FOREIGN PATENT DOCUMENTS

| | | | |
|---|---|---|---|
| DE | 4230706 | 3/1994 | |
| EP | 512615 | * 11/1992 | 211/26 X |

OTHER PUBLICATIONS

*Universal, Low-Cost Hard-File Mounting Assembly*, IBM Technical Disclosure Bulletin, vol. 28, No. 6, Nov. 1985, 2 pages.

*Spring-Loaded File Rails*, IBM Technical Disclosure Bulletin, vol. 28, No. 12, May 1986, 3 pages.

*Bridge Assembly for Mounting Interchangeable Electromagnetic Devices*, IBM Technical Disclosure Bulletin, vol. 29, No. 9, Feb. 1987, 2 pages.

*Direct-Access Storage Device Commodity-Stacking Plates*, IBM Technical Disclosure Bulletin, vol. 30, No. 1, Jun. 1987, 2 pages.

U.S. Appl. No. 09/691,382, filed Oct. 18, 2000; Entitled: "Rack System for Mounting Electronic Devices"; Inventor: Bolognia et al.

* cited by examiner

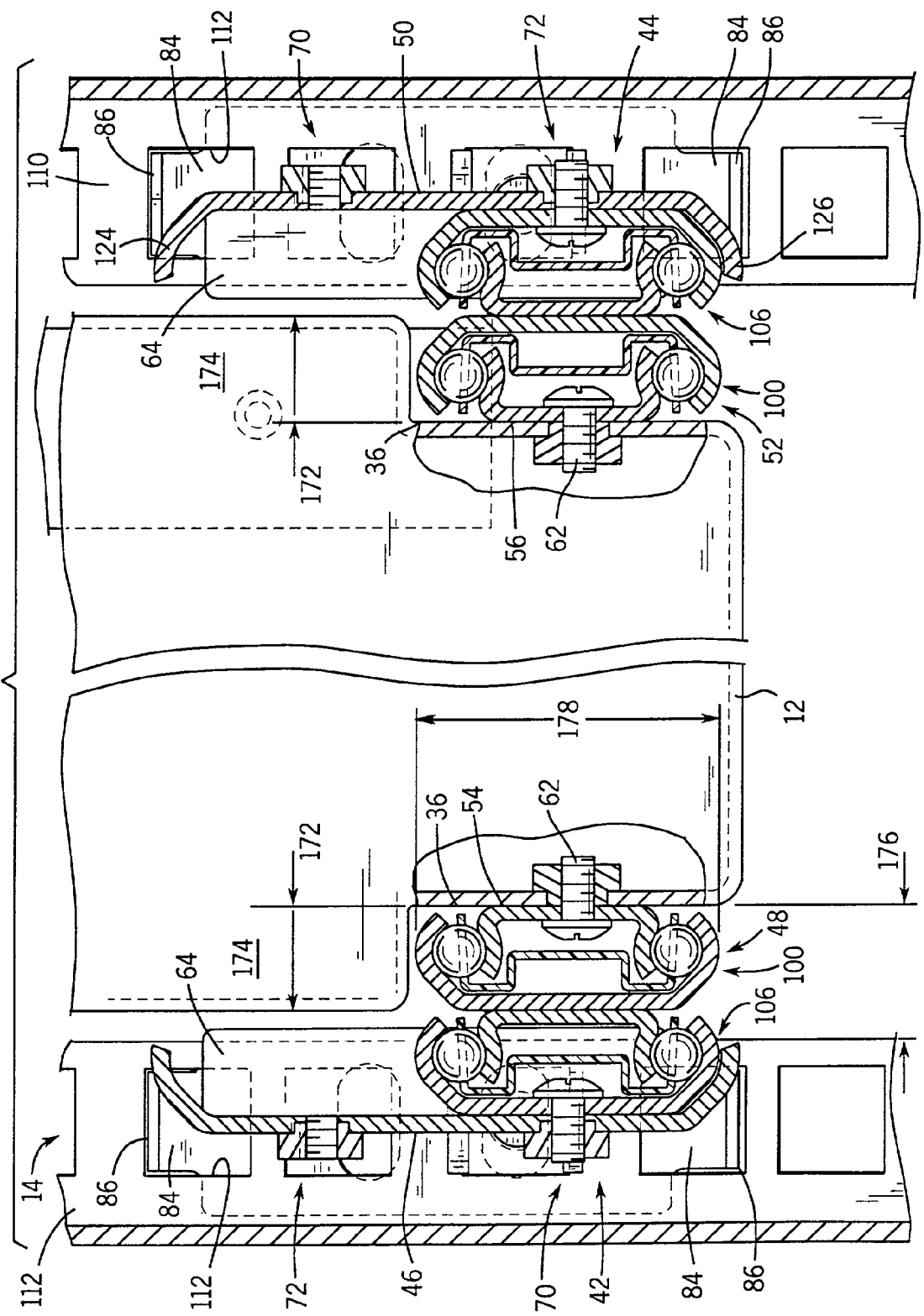

COMPUTER COMPONENT RACK MOUNTING ARRANGEMENT

BACKGROUND OF THE INVENTION

1. Field of the Invention

The present invention relates generally to the field of computer systems, such as servers, housed in a rack-mounted support structure. More particularly, the invention relates to a novel sliding rail support structure designed to provide increased internal volume in computer component enclosures in a low-profile rail arrangement.

2. Description of the Related Art

A variety of mechanical mounting structures have been devised for computer systems. In one type of computer system, typically referred to as server systems, a number of sub-components or servers are arranged in a central cabinet. The server enclosures are typically mounted in the cabinet in stacked vertical arrangements, with each server enclosure being secured within the cabinet by a sliding rail structure. The sliding rail structures permit the servers to be extracted and reinserted easily into the cabinet, such as for servicing of internal components of the servers. In general, it is desirable to allow each server to be fully or nearly fully withdrawn from the cabinet in order to gain a high degree of access to internal components of the individual server. Following such service, the individual server may be closed and reinserted into the cabinet for normal operation.

Conventional server rail mounting racks include side support rails which interface with a sliding rail. The support rail is mounted within the cabinet, while the sliding rail is secured to the individual server enclosure. Because the servers are often quite heavy, and, when fully extended, constitute a significant cantilevered load, the support and sliding rail structures must offer a considerable resistance to loading, while affording easy sliding motion during displacement of the server.

While sliding rail mounting structure of the type described above are generally quite effective at adequately supporting servers and other computer components, they were not without drawbacks. For example, for ease of servicing of internal components of each individual enclosure, it is desirable to allow some access to internal circuitry housed within each enclosure while not requiring the component enclosure to be removed from the rail mounting structure. While some degree of access may be provided by securing the sliding rail component of the structure adjacent to the bottom of the enclosure, allowing the top of the enclosure to be removed, conventional sliding support structures nevertheless do not provide adequate access to lower regions of the enclosure owing to the height of the sliding rail. Moreover, because the rail structure, including both the support and sliding rails, occupies some lateral volume within the cabinet or rack, the available volume for the circuitry inside each server enclosure is reduced. Conventional enclosures typically include flat vertical side panels which are secured to the sliding rail structures, resulting in loss of the entire volume above the sliding rail structures on either side of the enclosure.

There is a need, therefore, for an improved technique for retractably mounting computer components within a cabinet or rack. In particular, there is a need for a telescopically sliding rail mount which can reduce the profile of structures attached to server enclosures, effectively increasing the access volume when the server is retracted from the cabinet, and increasing the useful volume within the server enclosure. Furthermore, there is a need for a support structure for computer components which offers both the access and volume advantages aforementioned in a relatively simple structure consisting of interchangeable or symmetrical parts which can be mounted on either left or right-hand sides of a component cabinet.

SUMMARY OF THE INVENTION

The present invention provides a novel sliding rail mounting arrangement for a computer component rack designed to respond to these needs. The technique makes use of symmetrical components which can be mounted on either side of a support rack, and which significantly reduces the profile of components mounted directly adjacent to the component enclosure. The structure offers similar mechanical load-bearing capabilities to those of conventional structures, and may be configured to interface with racks of conventional design. By virtue of the reduced height profile of the sliding rail structure, volumes on either side of the component enclosure may be recaptured within the internal volume of the enclosure, for use in mounting internal circuitry and elements of the system. Similarly, the reduced height profile of the sliding rail components of the system permit greater access to the interior volume of the enclosures when the components are retracted from the cabinet for servicing.

Thus, in accordance with one aspect of the invention, a rack mounting system is provided for retractably supporting a computer system component in a computer rack. The system includes identical left and right support rails each being securable in the rack in mutually facing parallel relation. Each support rail includes first and second securement regions adjacent to longitudinal edges. The regions are symmetrical about the longitudinal axis of the support rail. The system also includes identical left and right slide assemblies secured to support regions of the support rails. The support rails may be recessed into the rack to provide additional space within the rack for the computer component. The slide assemblies are preferably substantially smaller in profile than the support rails, thus further reducing the space requirements of the system within the volume occupied by the component.

In accordance with another aspect of the invention, a rail assembly is provided for retractably supporting a computer component in a component rack. The rail assembly includes a support rail and a slide assembly. The support rail is secureable in a component rack and includes an elongated web portion and first and second flanges bordering the web portion. The support rail also includes first and second mounting regions which are symmetrical about its longitudinal axis. The slide assembly is configured to slidingly support the component on the support rail. The slide assembly includes mutually mating rails telescopically secured to another. The slide assembly is mountable on the support rail in either the first or second mounting region. The slide assembly may include multiple sets of telescoping rails, and preferably has a height profile substantially less than that of the support rail.

The invention also relates to a rack mounted computer system. The system includes a rack having front and rear access sides, and left and right side panels extending therebetween. A computer component having an enclosure for supporting internal hardware is mounted within the rack via left and right sliding support assemblies secured to left and right peripheral sides of the component enclosure. Each sliding support assembly includes a support rail and a slide assembly mounted to the support rail. The support rails are secured in the rack, while the slide assemblies extend between the respective support rails and a lower recess in the component enclosure. The support rails have support regions which are symmetrically disposed about a longitudinal axis, permitting the support rail to be used on either side of the rack, and identical slide assemblies to be secured thereto to define the sliding support assemblies.

BRIEF DESCRIPTION OF THE DRAWINGS

The foregoing and other advantages of the invention will become apparent upon reading the following detailed description and upon reference to the drawings in which:

FIG. 9 is a partial sectional view of the fully assembled rail mounting system illustrating both left and right rail structures mounted to a server enclosure for supporting the server in the component rack.

DETAILED DESCRIPTION OF SPECIFIC EMBODIMENTS

Figure 1:
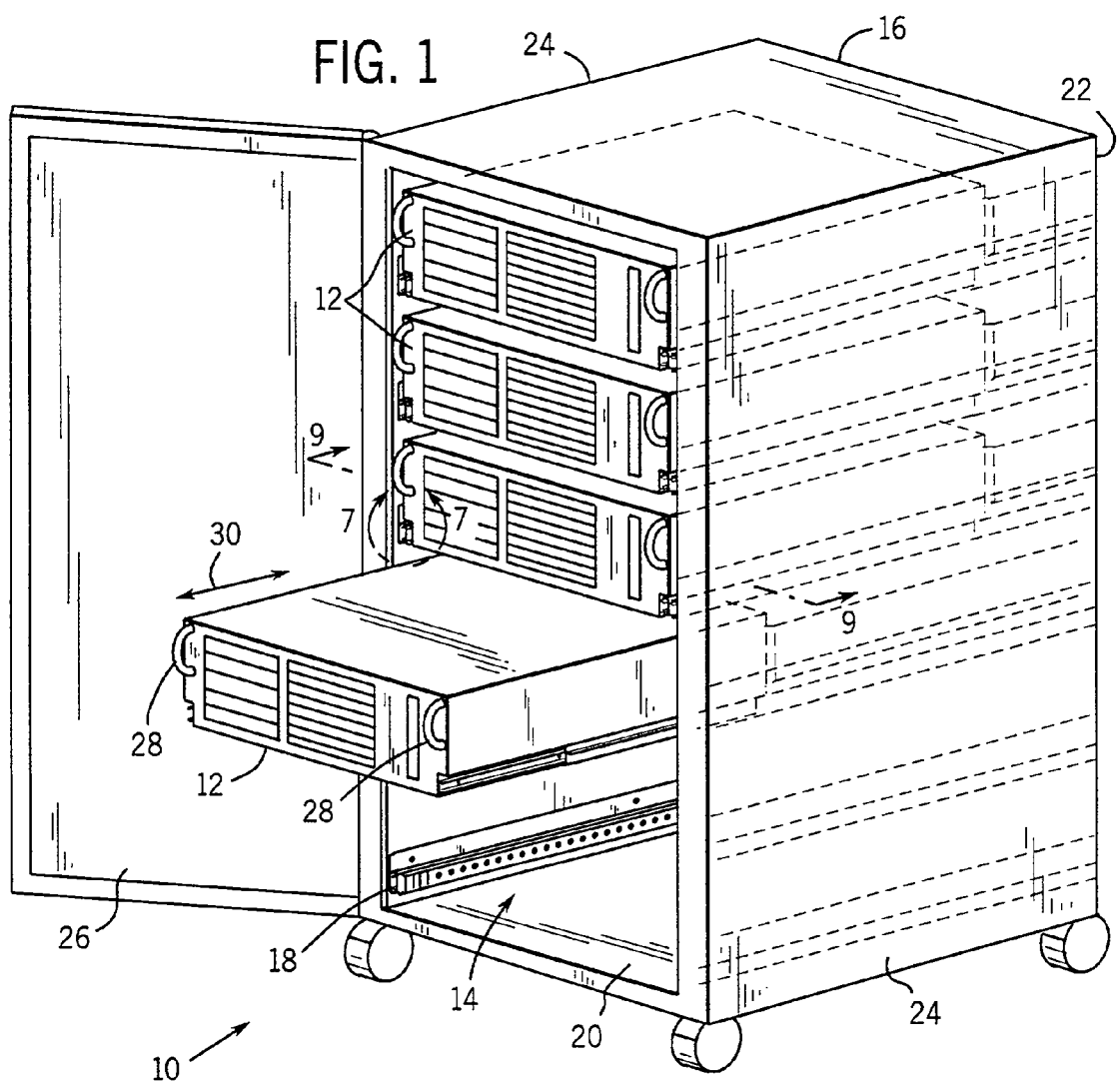
FIG. 1 is a perspective view of a rack mounted computer system including a plurality of servers housed within a rack or cabinet.

Turning now to the drawings, and referring first to FIG. 1, a rack-mounted computer system is illustrated generally and designated by the reference numeral 10. System 10 includes a plurality of components or servers 12, such as an individual server, supported in a vertical mounting rack 14. In the illustrated embodiment, rack 14 is constructed within a storage cabinet 16. Rack 14 includes a rail system, designated generally by the reference numeral 18, for supporting each individual server and for permitting the server to be recessed or inserted into the rack, or drawn from the rack for servicing, while remaining mechanically supported by cantilevered sliding rail arrangements as described more fully below.

Rack 14 and cabinet 16 include a front access opening 20 through which the servers may be retracted and reinserted, and a rear access opening 22 through which necessary connections may be made to each individual server for coupling the server to external components or to one another. Side panels 24 extend between front and rear access openings 20 and 22 to enclose the internal volume of the cabinet in which the servers are positioned. A front access door 26 is provided to close the cabinet when all of the servers are positioned in the rack. A similar access door (not shown) may be provided on rear access end 22, and may include a grill or perforated cover through which air may flow for cooling of the servers in a manner generally known in the art.

Figure 2:
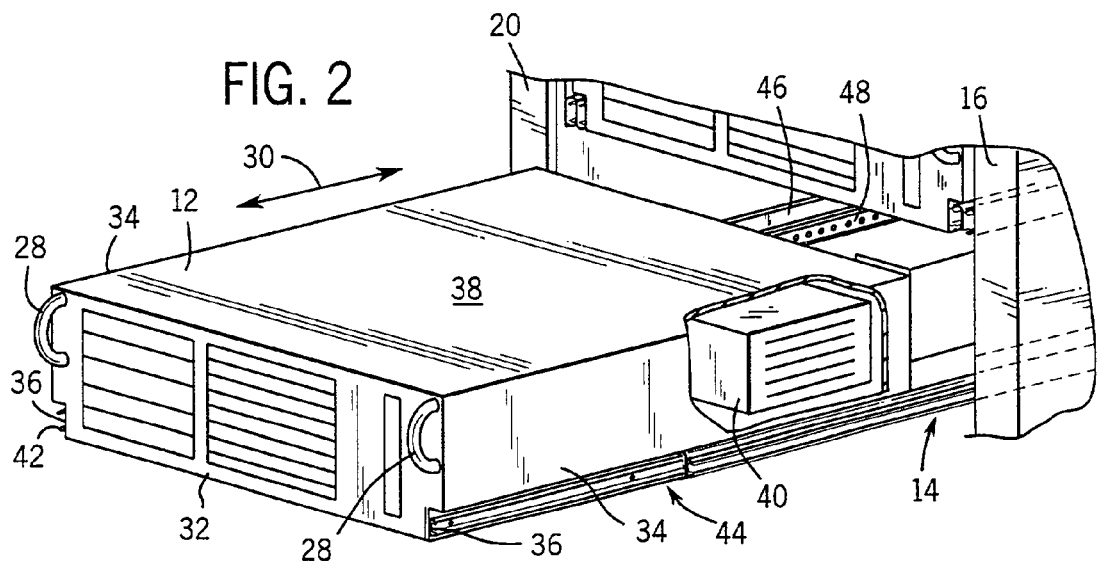
FIG. 2 is a detailed view of one of the servers of FIG. 1 withdrawn from the rack via a sliding support rail structure.

As shown in FIGS. 1 and 2, handles 28 are provided on a front side of each server 12 to facilitate retraction and reinsertion of the server in the rack, as indicated by bi-directional arrow 30. Moreover, each server includes an outer enclosure 32 having lateral sides 34. In the illustrated embodiment, recesses 36 are formed in lower regions of each lateral side to accommodate a sliding rail arrangement which supports the server in the rack, while permitting the server to be easily retracted and reinserted. An upper cover 38 of each server may be removed to access internal components supported within enclosure 32.

It has been found that in heretofore known retractable server rack mounting systems, access to internal components of each individual server can be significantly hindered by the arrangement and profile of sliding rail structures used to support the servers. In the illustrated embodiment, the profile of the rail mounting structures is maintained at a minimum, and certain support rail structures are recessed into the rack as described more fully below, to provide a high degree of accessability to internal components within the individual server as well as additional volume within the server enclosure for mounting of such component. In FIG. 2, for example, a slot mounting structure 40 within enclosure 32 is accessable at lower regions due to the low profile of the rail mounting structures described below. Upper cover 38 may therefore be entirely removed down to the level of recesses 36 to gain access to such components.

Figure 3:
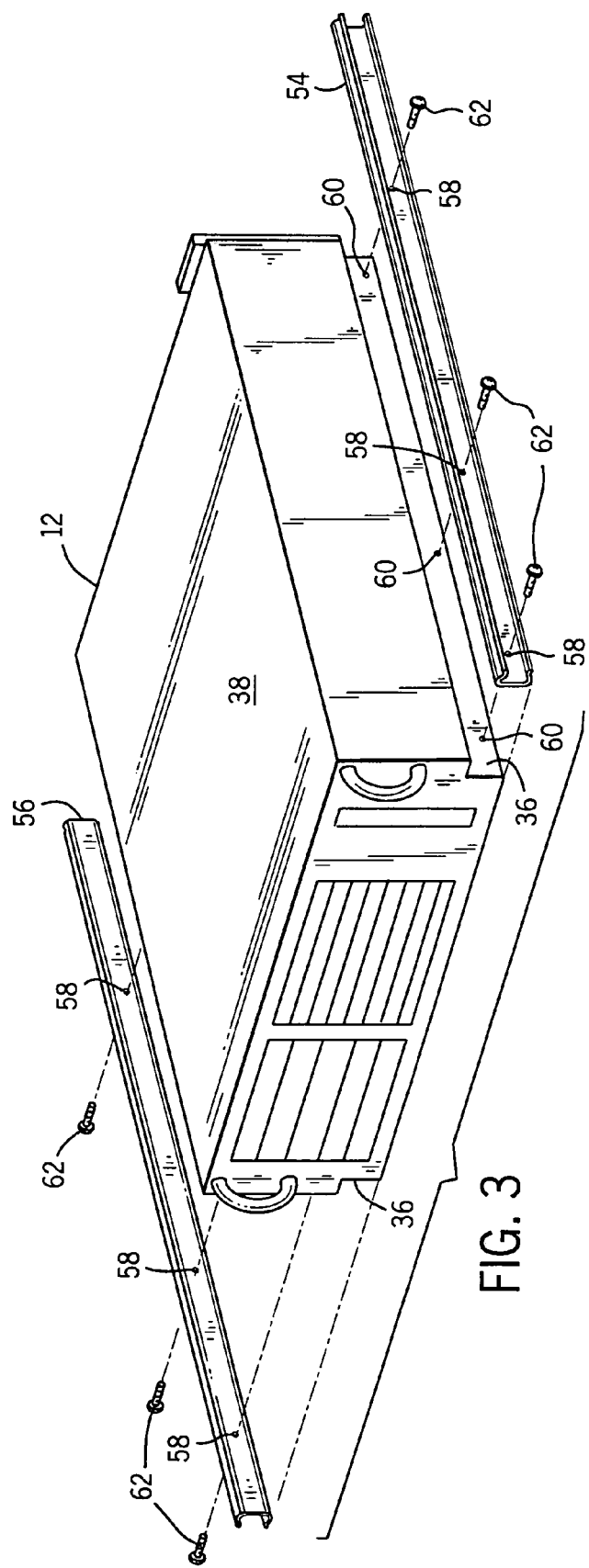
FIG. 3 is an exploded view of the server of FIG. 2 illustrating a manner in which a component-mounted sliding rail may be secured to the component housing.
Figure 4:
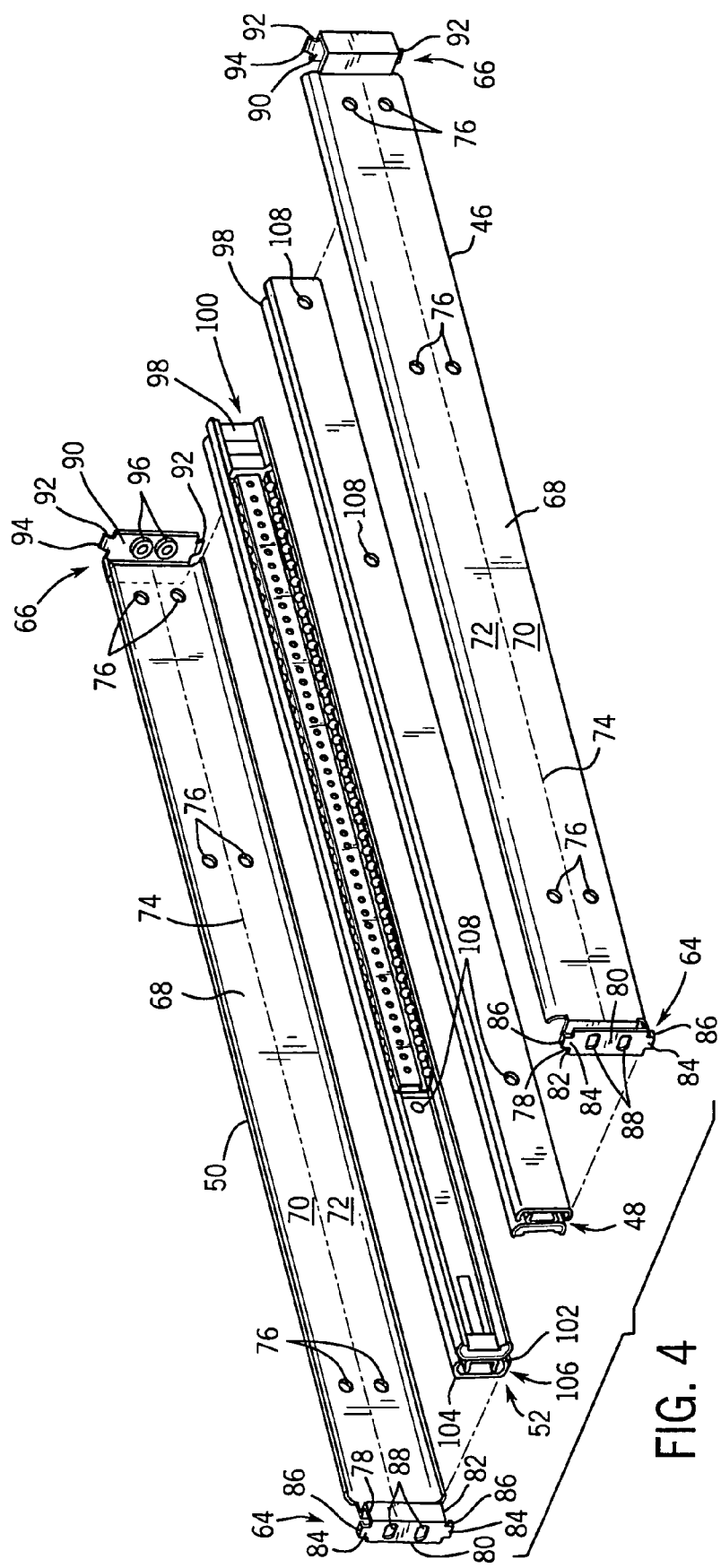
FIG. 4 is an exploded view of a pair of support rails and slide assemblies for securing the structure of FIG. 3 within a supporting component rack.

As shown in FIG. 2, the rail system includes a left rail assembly, designated generally by the reference numeral 56 and a right rail assembly 54, when viewed from a position in front of the server. As best illustrated in FIGS. 3 and 4, left rail assembly 56 includes a left support rail 46 (see FIG. 4) and a left slide rail assembly 48. Similarly, right rail assembly 44 includes a right support rail 50 and a right slide rail assembly 52. The slide rail assemblies include rails designed to be fixed directly to the component enclosure, as illustrated in FIG. 3, as well as additional rails for providing slidingly telescoping structures for ease of retraction and reinsertion of the component within the rack. As described more fully below, the elements of these rail structures on the left and right sides of the component are identical to one another but are assembled differently, thereby reducing the number of different parts in the rail system and facilitating assembly. Moreover, the support rail assemblies on the left and right sides of the component include symmetrical mounting regions for securement to respective slide rail assemblies. It has been found that this structure, described more fully below, again reduces the number of different parts in the rail system, while offering a low profile for attachment to the component, and assuring a sufficiently rigid support system for attachment to the rack.

Referring specifically now to FIG. 3, server 12 is illustrated adjacent to left and right component rails 54 and 56, respectively. Each component rail includes apertures 58 spaced along its length, which align with similar apertures 60 disposed in recesses 36 on each side of the server 12. Nuts (not shown) retained within server 12 adjacent to recess 36 and behind apertures 60, receive fasteners 62 which traverse apertures 58 and 60 for attachment of rails 54 and 56 to the server enclosure. Rails 54 and 56 form part of slide rail assemblies 48 and 52, respectively. The remaining components of these assemblies are illustrated in FIG. 4.

As shown in FIG. 4, compound slide rail assemblies are secured to the support rails in one of two symmetrical support regions. It should be noted that in the illustration of FIG. 4, the support and slide rail assemblies are shown from a rear perspective, opposite that of the front perspective of FIG. 3, such that the left rails are illustrated in the lower position, while the right rails are illustrated in an upper position. As shown in FIG. 4, each support rail 46 and 50 includes a rear securement bracket 64 and a front securement bracket 66 for fixing the support rails into the component rack as described below. Extending between the rear and front securement brackets, a central region 68 forms first and second mounting regions 70 and 72, disposed symmetrically about a longitudinal axis 74 of each rail. The mounting regions 70 and 72 each include apertures 76 for receiving fasteners used to attach the slide rail assemblies to the support rails. Other structures of each rail, including the rear and front securement brackets, are similarly symmetrical about the longitudinal access 74 of each rail, enabling identical rails to be used on either left or right sides of the rack by inverting the rail about the longitudinal axis. Thus, as shown in FIG. 4, first mounting region 70 is located in an upper position on right support rail 50, while the same region is located in a lower position on left support rail 46. The slide rail assemblies may be secured in either mounting region.

Referring to the illustrated embodiment of the rear securement bracket 64, each bracket structure is conveniently formed as an integral piece with the support rail, such as by a series of stamping and bending operations. Each rear securement bracket 64 includes a recessing extension 78 designed to place the mounting regions of the support rails in a recessed position within the rack with respect to the mounted component as described more fully below. The brackets further include an attachment flange 80 generally parallel to the recessing extension, and a linking plate or extension 82 extending between the recessing extension and the attachment flange. Engagement tabs 84 are formed on upper and lower extremities on each attachment flange 80, and anti-rotation extensions 86 extend in a forward direction from each engagement tab. The engagement tabs permit the rails to be mounted in a rack and to engage apertures in the rack, as described below, while restraining the rails from twisting under the moment created by the supported component. Finally, each rear securement bracket includes a pair of apertures 88 for receiving fasteners for securing the support rail to the rack.

Front securement brackets 66 on each support rail include a front attachment flange 90, having upper and lower engagement tabs 92, each terminating in an anti-rotation extension 94. While front attachment flanges 90 may be generally similar to attachment flanges 80 formed on rear securement brackets 64, should be noted that the anti-rotation extensions 94 extend in a forward direction, permitting the rails to be easily secured to the rack structure by a forward motion engaging all of the anti-rotation extensions into the rack on both front and rear ends as described below. A pair of clinch nuts 96 are supported behind each front attachment flange 90 and aligned with apertures (not shown) in the front attachment flanges for receiving fasteners used to secure the brackets to the rack.

Also as shown in FIG. 4, slide rail assemblies 48 and 52 each include an inner slide rail 98 designed to mate with a component rail 54 or 56 (see FIG. 3) to form a first telescoping set 100 of slide rails. In the illustrated embodiment, the slide rail assemblies each include a pair of such telescoping rail sets, including an outer pair of rails 102 and 104 which mate to form a second set 106. Slide rail sets 100 and 106 are secured to one another by securing rail 98 of the first set in a back-to-back relationship with rail 102 of the second set. Apertures 108 are formed through the slide rail sets to permit the slide rail sets to be secured to one of the mounting regions 70 or 72 of a support rail via fasteners (not shown).

Figure 5:
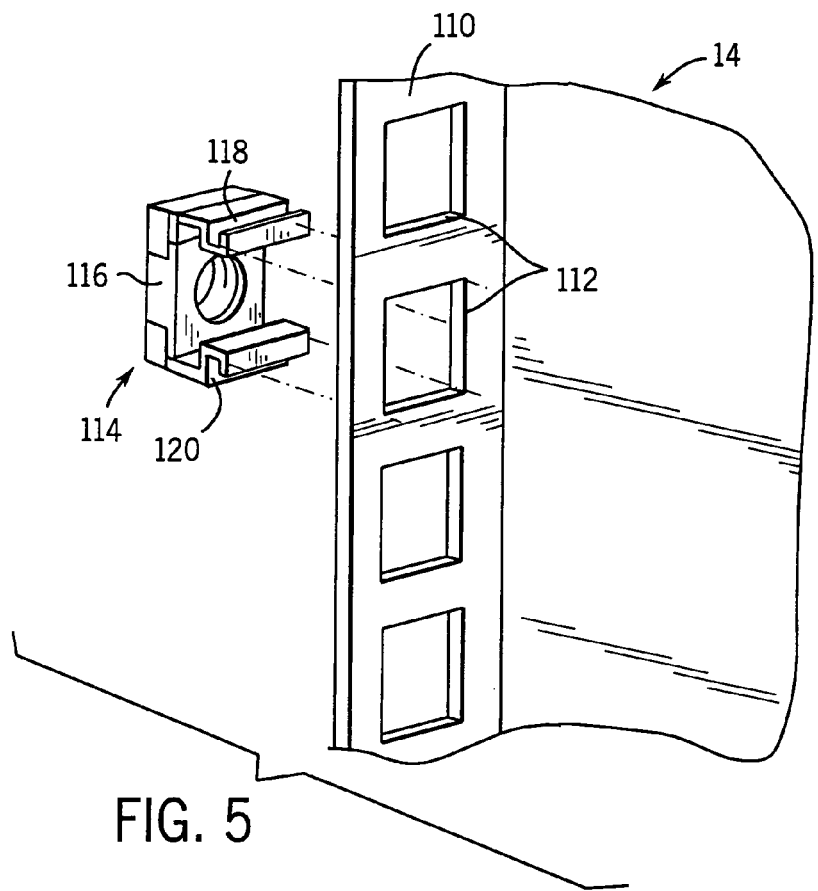
FIG. 5 is a perspective view of a nut subassembly for use in securing the support rails of FIG. 4 within a component rack.
Figure 6:
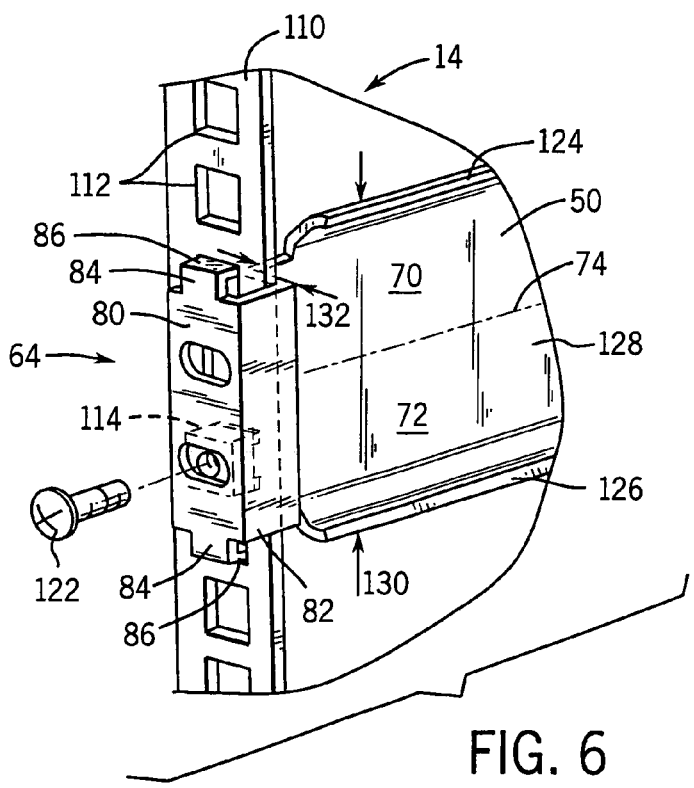
FIG. 6 is a perspective view of a portion of a support rail of the type shown in FIG. 4 illustrating an exemplary manner in which the support rail may be mounted in the component rack.
Figure 7:
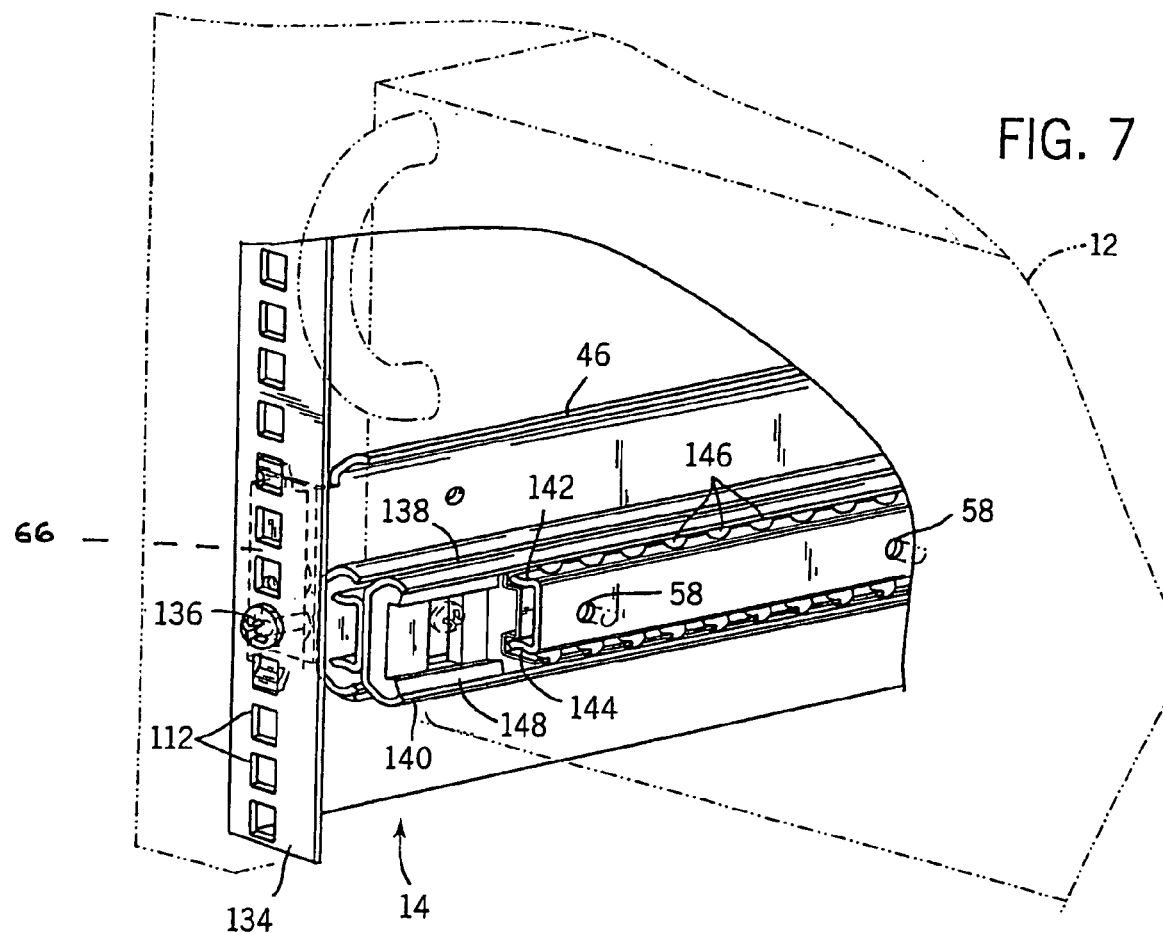
FIG. 7 is a perspective view of a front portion of a support rail of the type shown in FIG. 4 following mounting to the component rack and after attachment of completed slide assemblies including rails of the type shown in FIGS. 3 and 4.

The manner in which the rail assemblies described above are secured to the rack in accordance with a presently preferred arrangement is illustrated in FIGS. 5, 6, and 7. Referring to FIG. 5, rack 14 is conveniently formed with an integral rear mounting flange 110 extending inwardly on either side of the rack. A series of mounting apertures 112 are formed in the rear flange, such as in a square configuration, to facilitate mounting of the rails and other components of the system and to prevent twisting of the rails. To facilitate mounting of the support rails, a cage nut assembly 114 is conveniently secured to the rear flange to receive fasteners extending through rear securement brackets 64 (see FIG. 6). In the illustrated embodiment, each cage nut assembly 114 includes a threaded nut 116 housed between an upper retaining clip 118 and a similar facing lower retaining clip 120. Retaining clips 118 and 120 are somewhat resilient, permitting them to be deformed slightly and inserted into an aperture 112 in rear flange 110. Following insertion of a cage nut assembly in appropriate locations along rear flanges 110 on both left and right sides of the rack, the support rails may be mounted to the rack as illustrated in FIG. 6.

As shown in FIG. 6, the cage nut assembly 114 is mounted in a location corresponding to the preferred level at which one of the mounting regions 70 or 72 of the support rail will be located. The support rails, such as right support rail 50 shown from a rear perspective view in FIG. 6, are then positioned such that the rear flanges extend into a space between recessing extension 78 and attachment flange 80, and are urged in a forward direction to engage anti-rotation extensions 86 into corresponding apertures 112 on either side of cage nut assembly 114. A fastener 122 is then inserted into cage nut assembly 114 through one of the apertures provided in attachment flange 80 of each rear securement bracket. As fastener 122 is tightened in cage nut assembly 114, anti-rotation extensions 86 are lodged securely within apertures 112 to resist torsion of the support rail in the rack. Similar securement is performed on a front side of the rack as described more fully below.

FIG. 6 also illustrates a presently preferred arrangement of each support rail with respect to other features of the rack system. In particular, each support rail includes a first or upper flange 124 and a second or lower flange 126 provided on either side of an integral web 128. Mounting regions 70 and 72 are formed in web 128, and flanges 124 and 126 lend a greater resistance to torsional loading of the rail, while assisting in locating and supporting the slide rail assemblies in the mounting regions. The resulting structure has a height 130 as defined by the upper and lower flanges which is substantially greater than the reduced profile of the slide rail assemblies. Moreover, by virtue of the configuration of the support rail and securement brackets, the support regions 70 and 72 of the rails are recessed by a distance 132 in a direction generally away from the component. As discussed below with reference to FIG. 9, this additional recessing affords a greater useful volume within the supported components as compared to heretofore known systems.

As the support rails are secured at a rear end as described above with reference to FIG. 6, they are also secured at front ends as shown in FIG. 7. In the exemplary configuration of FIG. 7, the left support rail 46 is illustrated with a 2-set slide rail assembly already fixed in place. As discussed above, in practice, the slide rail assemblies will ordinarily be assembled as shown in FIG. 7 only after attachment to the server or component 12 illustrated in broken lines in FIG. 7. In addition to the integral rear mounting flanges described above, rack 14 also preferably includes an integral front mounting flange 134 on either side of the component access opening. Front flanges 134 include apertures 112 similar to those of the rear mounting flanges. As the rear of each support rail is secured to the rear mounting flanges, as described above with reference to FIG. 6, the front securement bracket 66 of each rail is also located at a desired level or position with respect to a front flange 134. As the rail is urged in a forward direction by tightening of a fastener 122 in the rear securement bracket structure (see FIG. 6), the front securement bracket of the rail is urged towards an inner side of the front flange to urge the anti-rotation extensions of the front securement bracket into corresponding apertures 112. A fastener 136 is then inserted and secured in one of the clinch nuts 96 (see FIG. 4) of the front securement bracket. Thus, in a straightforward manner, and employing only a single rear and a single front fastener, each support rail is secured in a desired location within the rack, and prevented from rotating under the weight of the supported component.

Also shown in FIG. 7, the rails of each slide rail assembly set include flanges which mate to form inner and outer races of anti-friction bearings. Thus, as shown in FIG. 7, each set includes a rail forming outer races by virtue of upper and lower flanges 138 and 140, and a smaller inner rail forming inner races by virtue of flanges 142 and 144. A series of anti-friction bearing elements 146 are disposed between the mutually facing inner and outer flanges to facilitate gliding or sliding motion of the smaller rail within the larger. Finally, stops or bumpers 148 may be provided within the slide rail assemblies to limit motion of one or more of the mutually engaging rails with respect to one another.

Figure 8:
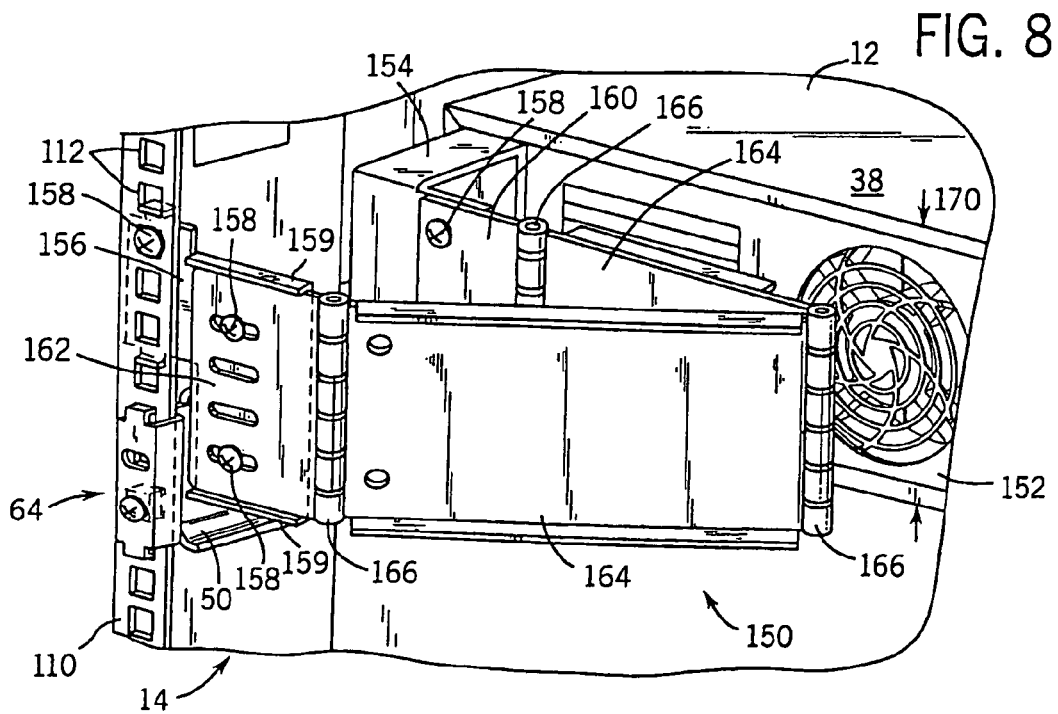
FIG. 8 is a perspective view of a cable support structure for use in the rack mounting system, permitting cables to be extensively coupled between the rear portion of the rack and a rear face of a server or other component.

The mounting system in accordance with the present technique also facilitates support of cables and similar flexible conductors linked to the individual servers or components mounted within the rail system. FIG. 8 illustrates an exemplary configuration of a cable arm 150 used to support such cabling (not shown in FIG. 8 for the sake of clarity). Cable arm 150 is designed to be secured both to the component 12 and to rack 14 and to articulate between the component and the rack as the component is slid or retracted from the rack, or slid back into or reinserted into the rack. To facilitate attachment to the component and to the rack, the rear 152 of the component enclosure supports a component interface bracket 154, while a rack interface bracket 156 is secured to a rear flange 110 of the rack, such as via one or more fasteners 158.

Cable arm 150 includes a component-side mounting bracket 160 which is secured to component interface bracket 154 by means of one or more fasteners 158. On an opposite end of cable arm 150, a rack support bracket 162 is secured to rack interface bracket 156 by means of similar fasteners 158. In the illustrated embodiment, rack interface bracket 156 includes upper and lower anti-rotation flanges 159 which engage bracket 162 to prevent rotation of the cable arm and to maintain the cable arm in a cantilevered position behind component 12. The cable arm assembly further includes a series of support plates 164 pivotally secured to one another by hinges 166.

In the illustrated embodiment, the cable arm assembly is particularly well suited to maintaining cables in a desired envelope dimension of the component. In particular, a reference dimension 170 of the outer enclosure of component 12 is preferably used as a basis for the overall height of the interfacing brackets and cable arm assembly components, such that all cable arm components and supported cables remain within the envelope dimension defined by the height 170. This dimensional constriction advantageously facilitates insertion and removal of components within the rack without requiring partial dismantling of support structures of neighboring components.

FIG. 9 represents components of the fully assembled support and slide mounting structures described above and presently preferred dimensional relationships between the structures. In particular, as shown in FIG. 9, identical left and right support rails of 46 and 50 are mounted within rack 14 on left and right flanges of the rack. Symmetrical mounting regions on each support rail receive corresponding left and right slide rail assemblies 48 and 52. In the embodiment illustrated in FIG. 9, the slide rail assemblies are mounted in lower positions on the support rails. However, where desired, the slide rail assemblies may be mounted in mutually facing upper positions.

The preferred configuration of the support rail and slide rail assemblies facilitates the use of identical components throughout the system. In particular, not only are the support rails identical to one another, but individual slide rail sets within the slide rail assemblies may similarly be identical.

The foregoing structures offer the additional advantage of providing a low profile slide rail structure, while supporting the slide rail structure on a high moment of inertia support rail. Moreover, recessing of the support rails within the rack, while providing slide rail assemblies which extend into the region supporting the component allows a maximum width dimension to be employed in the design of the component enclosure. Thus, the slide rail assemblies extend into the component enclosure only by a dimension slightly greater than that of the lower recess, as represented by reference numeral 172 in FIG. 9, thus providing an enhanced component enclosure extension 174 on either side of the component. In the illustrated embodiment, the stacked sets of slide rails in the slide rail assembly provide a slide rail extension 176 which, in appropriate cases, may be further minimized by reduction in the width profile of the slide rail sets. Finally, the reduced height of the slide rails reduces the overall height dimension over which the rail support structure extends on each lateral side of the component. In the illustrated embodiment, the height of the slide rail assemblies, represented by reference numeral 178 in FIG. 9, is approximately one half of the overall height of the support rails, allowing an approximately equal dimension to be added to the interior of the component enclosure and accessed upon removal of the upper cover of the enclosure.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A mounting system, comprising:
   first and second rack members each having a peripheral edge, wherein the peripheral edges of the first and second rack members lie in a common plane; and a telescoping rail assembly mounted to the first and second rack members such that a first moveable portion of the telescoping rail assembly is located on one side of the common plane and a second movable portion of the telescoping rail assembly is located on an opposite side of the common plane.

2. The mounting system as recited in claim 1, the telescoping rail assembly comprising:
   a first telescoping slide rail mountable to a support rail mounted to the pair of rack members; and
   a second telescoping slide rail mounted to the first telescoping rail.

3. The mounting system as recited in claim 2, wherein the first telescoping slide rail does not extend beyond the pair of rack members.

4. The mounting system as recited in claim 2, wherein the telescoping rail assembly has a height approximately one half a height of the support rail.

5. The mounting system as recited in claim 1, comprising:
   third and fourth rack members each having a peripheral edge, wherein the peripheral edges of the third and fourth rack members lie in a second common plane; and
   a second telescoping rail assembly mountable to the third and fourth rack members such that a first moveable portion of the second telescoping rail assembly is located on one side of the second common plane and a second movable portion of the second telescoping rail assembly is located on an opposite side of the second common plane, the second telescoping rail assembly being in a mirror-image orientation with respect to the first telescoping rail assembly.

6. A mounting assembly for a computer rack system, comprising:
   a first support rail mountable to a first pair of rack members via a first pair of mounting flanges;
   a second support rail mountable to a second pair of rack members via a second pair of mounting flanges;
   a first telescoping rail assembly mounted to the first support rail, wherein the first pair of mounting flanges extends in a direction toward the first telescoping assembly; and
   a second telescoping rail assembly mounted to the second support rail, wherein the second pair of mounting flanges extends in a direction toward the second telescoping assembly.

7. The mounting assembly as recited in claim 6, wherein the first and second support rails are substantially identical to one another.

8. The mounting assembly as recited in claim 6, wherein the first and second telescoping rail assemblies are substantially identical to one another.

9. The mounting assembly as recited in claim 6, comprising a storage assembly including the first and second pairs of rack members, the first pair of rack members located at a first side of the storage assembly, and the second pair of rack members located at a second side of the storage assembly opposite the first side, wherein the storage assembly is configured to receive a computer component enclosure.

10. The mounting assembly as recited in claim 9, wherein the storage assembly is configured to receive a plurality of computer component enclosures.

11. The mounting assembly as recited in claim 6, wherein the first and second telescoping rail assemblies each comprise:
   a first telescoping slide rail mountable to the support rail; and
   a second telescoping slide rail mounted to the first telescoping slide rail.

12. A computer rack system, comprising:
   a storage assembly including first and second pairs of rack members, the first pair of rack members located at a first side of the storage assembly, and the second pair of rack members located at a second side of the storage assembly opposite the first side;
   a first support rail mounted to the first pair of rack members, such that the entire length of the first support rail is wholly between the first pair of rack members and such that no portion of the first support rail extends outwardly in any direction from between the first pair of rack members;
   a second support rail mounted to the second pair of rack members, such that the entire length of the second support rail is wholly between the second pair of rack members and such that no portion of the second support rail extends outwardly in any direction from between the second pair of rack members;
   a first telescoping rail assembly mounted to the first support rail, the first telescopic rail assembly having a first portion that extends lengthwise beyond the first pair of rack members and a second portion that remains confined between the first pair of rack members; and
   a second telescoping rail assembly mounted to the second support rail, the second telescopic rail assembly having a third portion that extends lengthwise beyond the second pair of rack members and a fourth portion that remains confined between the second pair of rack members; and
   a computer component enclosure coupled to the first and second telescoping rail assemblies such that the computer component enclosure is slidably moveable between a first position inside the storage assembly and a second position extending from the storage assembly.

13. The computer rack system as recited in claim 12, wherein the computer component enclosure comprises recessed sections to which the first and second telescopic rail assemblies respectively couple.

14. The computer rack system as recited in claim 12, wherein the first and second support rails are substantially identical to one another.

15. The computer rack system as recited in claim 12, wherein the first and second telescoping rail assemblies are substantially identical to one another.

16. The computer rack system as recited in claim 12, wherein the computer rack system comprises a plurality of computer component enclosures.

17. The computer rack system as recited in claim 12, wherein each telescoping rail assembly comprises:
   a first telescoping slide rail coupled to the first support rail; and
   a second telescoping slide rail coupleable to the first telescoping rail and the computer component enclosure.

18. A method for supporting a computer enclosure, the method comprising:
   mounting a telescoping rail assembly to a pair of rack members, each of the rack members having a peripheral edge, wherein the peripheral edges lie in a common plane, such that a first moveable portion of the telescoping rail assembly is located on one side of the common plane and a second movable portion of the telescoping rail assembly is located on an opposite side of the common plane.

19. A storage assembly, comprising:

first and second rack members each having a peripheral edge, wherein the peripheral edges lie in a common plane; and means for mounting a telescoping rail assembly to the first and second rack members, such that a a first moveable portion of the telescoping rail assembly is located on the one side of the common plane, and a second movable portion of the telescoping rail assembly is located on an opposing side of the common plane.

20. A computer rack system, comprising:

a storage rack having a front frame portion and a rear frame portion being spaced apart from the front frame portion such that a rear surface of the front frame portion faces a front surface of the rear frame portion, the front frame portion having an inner periphery defining a first opening and the rear frame portion having an inner periphery defining a second opening;

a component support comprising:

a first rail assembly having a first support member and a first rail slidably coupled to the first support member, the first support member being coupled between the front frame portion and the rear frame portion on a first side of the front and rear frame portions such that the first support member does not extend into the first and second openings; and a second rail assembly having a second support member and a second rail slidably coupled to the second support member, the second support member being coupled between the front frame portion and the rear frame portion on a second side of the front and rear frame portions generally opposite the first side of the front and rear frame portions such that the second support member does not extend into the first and second openings.

21. The computer rack system, as set forth in claim 20, wherein the first rail assembly comprises a first component rail being slidably coupled to the first rail and being adapted to be fixedly coupled to a first side of a component to be placed within the first and second openings, and wherein the second rail assembly comprises a second component rail being slidably coupled to the second rail and being adapted to be fixedly coupled to a second side of the component.

22. The computer rack system, as set forth in claim 20, wherein the first support rail comprises a first end and a second end, the first end of the first support rail being coupled to the rear surface of the front frame portion and the second end of the first support rail being coupled to the front surface of the rear frame portion on the first side of the front and rear frame portions, and wherein the second support rail comprises a first end and a second end, the first end of the second support rail being coupled to the rear surface of the front frame portion and the second end of the second support rail being coupled to the front surface of the rear frame portion on the second side of the front and rear frame portions.

23. The computer rack system, as set forth in claim 20, wherein the first rail assembly is substantially identical to the second rail assembly.

24. The computer rack system, as set forth in claim 20, comprising a plurality of component supports.

25. The computer rack system, as set forth in claim 24, comprising a plurality of components, each of the plurality of components being supported by a respective one of the plurality of component supports.

26. The computer rack system, as set forth in claim 25, wherein at least one of the plurality of components comprises a computer component.

27. The computer rack system, as set forth in claim 25, wherein each of the plurality of components comprises a first side having a notch within which the first rail of the respective component support resides and a second side having a notch within which the second rail of the respective component support resides.

28. The computer rack system, as set forth in claim 20, comprising a component supported by the component support.

29. The computer rack system, as set forth in claim 28, wherein the component comprises a computer component.

30. The computer rack system, as set forth in claim 28, wherein the component comprises a first side having a notch within which the first rail resides and a second side having a notch within which the second rail resides.

* * * * *